US012796441B2

(12) United States Patent
Ghosh et al.

(10) Patent No.: US 12,796,441 B2
(45) Date of Patent: Nov. 10, 2026

(54) AUTOMATED POWER GRID METHODOLOGY WITH FLEXIBLE WALKING LOWER METAL PATTERNS

(71) Applicant: Advanced Micro Devices, Inc., Santa Clara, CA (US)

(72) Inventors: Partha Pratim Ghosh, Santa Clara, CA (US); Prashanth Muthu Swamy, Santa Clara, CA (US); Chuan Li, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 315 days.

(21) Appl. No.: 18/533,046

(22) Filed: Dec. 7, 2023

(65) Prior Publication Data

US 2025/0192047 A1 Jun. 12, 2025

(51) Int. Cl.
*H10W 20/41* (2026.01)
*G06F 30/398* (2020.01)

(52) U.S. Cl.
CPC ........ *H10W 20/427* (2026.01); *G06F 30/398* (2020.01)

(58) Field of Classification Search
None
See application file for complete search history.

(56) References Cited

U.S. PATENT DOCUMENTS

| | | | | |
|---|---|---|---|---|
| 2018/0090440 | A1 | 3/2018 | Schultz et al. | |
| 2018/0151411 | A1* | 5/2018 | Yang | G06F 30/394 |
| 2019/0236234 | A1* | 8/2019 | Biswas | G06F 30/392 |
| 2021/0202384 | A1* | 7/2021 | Peng | H10W 20/427 |

* cited by examiner

*Primary Examiner* — Jany Richardson
(74) *Attorney, Agent, or Firm* — Patterson + Sheridan, LLP

(57) ABSTRACT

Embodiments herein describe techniques for automated power grid methodologies with flexible walking lower metal patterns. In an example, an integrated circuit (IC) device includes multiple rows of voltage rails, including supply voltage rails and reference voltage rails, and a first column of elongated metal stubs, perpendicular to the rows of voltage rails, coupled to respective ones of the voltage rails via metal-filled vias of one or more dielectric layers to provide corresponding supply voltage stubs and reference voltage stubs, which may be arranged in an alternating sequence of supply voltage stubs and reference voltage stubs.

20 Claims, 15 Drawing Sheets

AUTOMATED POWER GRID METHODOLOGY WITH FLEXIBLE WALKING LOWER METAL PATTERNS

TECHNICAL FIELD

Examples of the present disclosure generally relate to integrated circuits and, more particularly, to automated power grid methodologies with flexible walking lower metal patterns.

BACKGROUND

An integrated circuit (IC) device may include a power distribution network that distributes a supply voltage to logic cells. A power distribution network may be provided in lower metal layers (e.g., M0 and M1, and an intervening via layer, via0).

Designing a power distribution network involves tradeoffs amongst performance (e.g., IR drop and routing congestion), reliability, and resource consumption (e.g., area/metal requirements). IR drop within a power distribution network may be reduced with relatively large vias and long metal stripes. The long metal strips may, however, reduce metal tracks/area that could otherwise be used for signal routing, which increases congestion. The conflict between IR drop and congestion is often resolved at the expense of increased size (e.g., silicon area).

SUMMARY

Techniques for automated power grid methodologies with flexible walking lower metal patterns are described. One example is an integrated circuit (IC) device that includes multiple rows of voltage rails, including supply voltage rails and reference voltage rails, and a first column of elongated metal stubs, perpendicular to the rows of voltage rails, coupled to respective ones of the voltage rails via metal-filled vias of one or more dielectric layers to provide corresponding supply voltage stubs and reference voltage stubs.

Another example is an IC power distribution grid that includes a first metal layer having multiple rows of metal tracks, a second metal layer having a first column of elongated metal stubs, perpendicular to the rows of metal tracks of the first layer, and a dielectric layer between the first and second metal layers, where the first column include a primary column having a first subset of the elongated metal stubs arranged linearly, length-wise, where adjacent ones of the elongated metals stubs of the first subset are separated from one another by a stub spacing, and where a sum of the stub spacing and a length of the elongated metal stubs of the first subset exceeds a row spacing of the rows of metal tracks of the first layer such that offsets between the elongated metal stubs of the first subset, relative to the metal tracks of the first layer, increase along a length of the primary column.

Another example is a method of designing a power distribution network of an IC design, including placing multiple rows of tracks in a first metal layer of the IC design, arranged in an alternating sequence of supply voltage tracks and reference voltage tracks, placing a first column of elongated stubs in a second metal layer of the IC design, perpendicular to the rows of tracks of the first layer, coupling the elongated stubs to respective tracks of the first layer, through vias of a dielectric layer placed between the first and second metal layers, to provide an alternating sequence of supply voltage stubs and reference voltage stubs.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
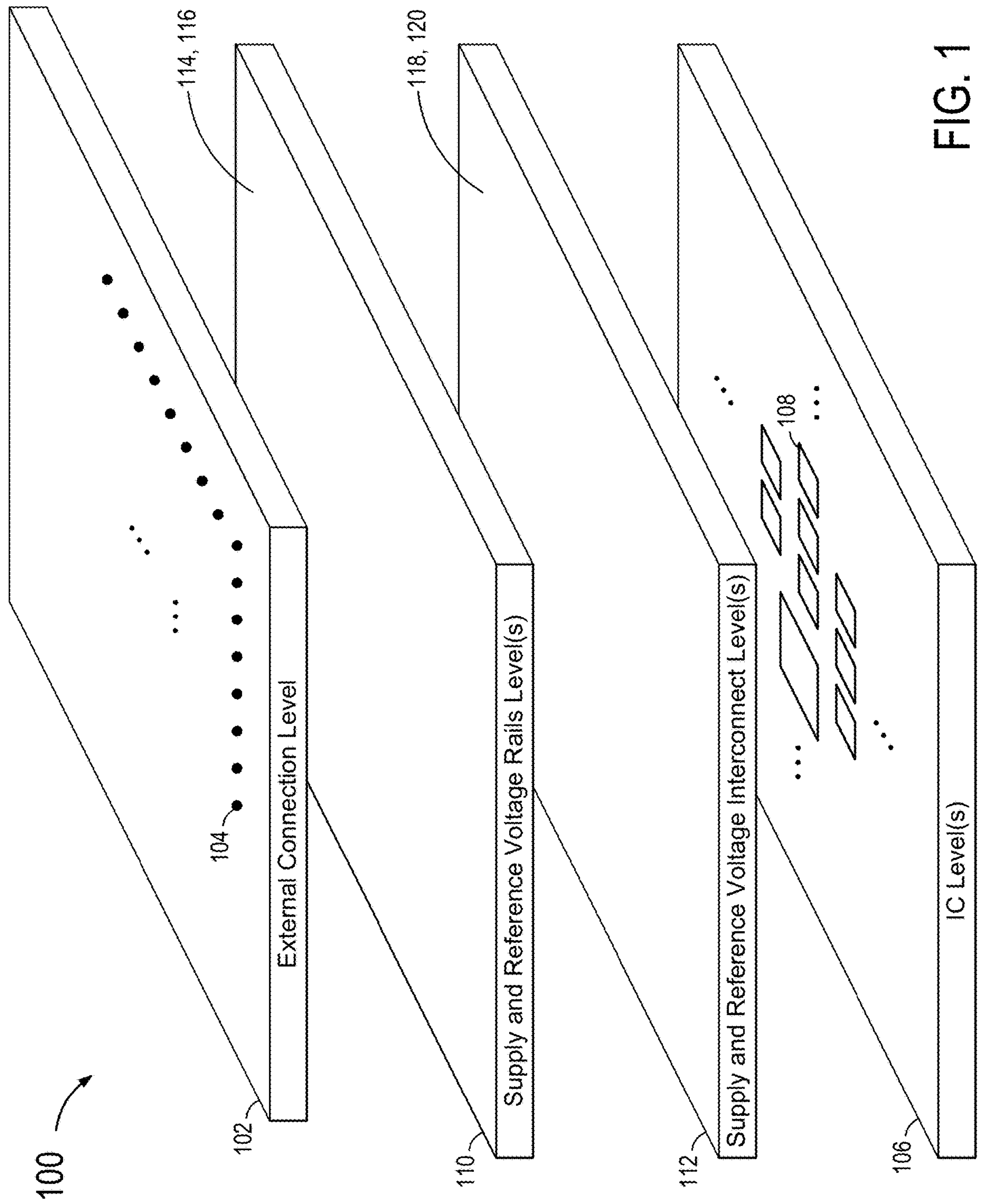
FIG. 1 is an illustration of an integrated circuit (IC) device, according to an embodiment.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe automated power grid methodologies with flexible walking lower metal patterns.

For smaller scale fabrication technologies (e.g., finFETs), vias and lower metal layers are bottle necks for dealing with IR drop and routing congestion (i.e., using lower metal layers for power distribution reduces area needed for signal routing). IR drop may be reduced with relatively large vias. However, design rule check (DRC) rules mandate relatively large vias be encompassed by relatively long metal stubs. This creates a trade-off between IR drop and congestion, which often results in increased silicon area. A finFET process may use long metal stripes and large vias for supply voltage and reference voltage (e.g., ground), in an alternating arrangement, which consumes more additional metal tracks and may further complicate signal routing congestion.

IR bottlenecks tend to be more pronounced at lower metal layers (e.g., metal layers M0 and M1 and an intervening via layer, via0, typically designated M0-via0-M1. Techniques disclosed herein may permit use of the largest available via radii (i.e., biggest available via0) for inter-layer electrical connections, and a DRC-free M1 stub enclosure. Using a biggest available via0 may permit a power grid to support greater numbers of standard cells (i.e., higher standard cell utilization for tiles of an IC design). Techniques disclosed herein may provide improved standard cell utilization with easier pin access.

Techniques disclosed herein include techniques to automate power grid design. The techniques include an innovative walking-style metal pattern that accommodates a largest available VIA0, and M1 Vdd-Vss on the same track. With the walking pattern, the M1 is strategically shifted every row, vertically, by an automated offset. In an embodiment, an M1 track may be saved for every 2 M1 tracks, compared to stripe-based Vdd/Vss architectures. Placing Vdd/Vss M1 stubs on the same metal track may reduce routing congestion.

Techniques disclosed herein may be useful to construct a tower-like power grid above M1 layers to move current in a vertical direction.

Techniques disclosed herein are technology-agnostic and DRC free/independent.

Techniques disclosed herein may be useful to reduce IR drop, grid resistance, and routing congestion. Techniques disclosed herein may thus render the trade-off between IR drop and routing congestion essentially moot.

Techniques disclosed herein may be suitable/useful for smaller-scale technology nodes.

Techniques disclosed herein may be useful for designing relative complex integrated circuit device with relatively small silicon areas.

FIG. 1 is an illustration of an integrated circuit (IC) device 100, according to an embodiment. In the example of FIG. 1, IC device 100 includes an external connection level 102 that includes external terminals, illustrated here as bumps 104. Level 102 may also be referred to as an upper or top level.

IC device 100 further includes an IC level 106 that includes integrated circuitry (e.g., logic/standard cells), such as a logic cell 108. IC Level 106 may be referred to as a bottom level. IC Level 106 may represent multiple IC levels. Input/output (IO) nodes of the integrated circuitry may be coupled to one or more external devices (e.g., another IC device and/or a host device) via bumps 104. Other ones of bumps 104 may be used to receive supply voltage and/or clocks.

IC device 100 further includes multiple intervening levels of interconnect (e.g., metal layers $M_0$ through $M_n$, and intervening via layers), that distribute supply voltages, reference voltages (e.g., ground), and clocks, from bumps 104 to the integrated circuitry, and that route signals to, from, and/or amongst the integrated circuitry. The via layers may include a dielectric (e.g., silicon di-oxide) having a grid of metal-filled vias that provide electrical connections between bumps 104, rails level 110, interconnect level 112, and IC level 106.

In the example of FIG. 1, the intervening levels of interconnect are collectively illustrated as a supply and reference voltage rails level (rails level) 110 (e.g., upper metal layers), and a supply and reference voltage interconnect level (interconnect level) 112 (e.g., lower metal layers M1 and M0, and intervening via layer via0). Rails level 110 and/or interconnect level 112 may represent multiple levels of interconnect.

Further in the example of FIG. 1, rails level 110 includes supply voltage rails 114 and reference voltage rails 116, which may receive a supply voltage Vdd and a reference voltage Vss (e.g., ground), respectively, from an external source via bumps 104. Supply voltage rails 114 and reference voltage rails 116 may also be referred to as Vdd rails and Vss rails, respectively. Supply voltage rails 114 and reference voltage rails 116 may be arranged in alternating rows of supply voltage rails and reference voltage rails. IC device 100 is not, however, limited to alternating rows of supply voltage rails and reference voltage rails. Supply voltage rails 114 and reference voltage rails 116 may be provided in a single interconnect/metal level or may be distributed across multiple interconnect/metal levels.

Further in the example of FIG. 1, interconnect level 112 includes supply voltage tracks 118 (e.g., strips or stubs) and reference voltage tracks 120 that distribute supply voltage Vdd and reference voltage Vss from supply voltage rails 114 and reference voltage rails 116 to logic cells of IC level 106, respectively. Interconnect level 112 may further include power and clock distribution tracks and signal routing tracks.

Rails level 110 may include relatively thick and wide metal traces or tracks, with relatively wide spacing between the metal tracks. Such metal tracks may have relatively low resistance and RC time constants. Interconnect levels 112 may have relatively thin, narrow, tightly packed metal tracks, which may be used for local interconnections.

Figure 2:
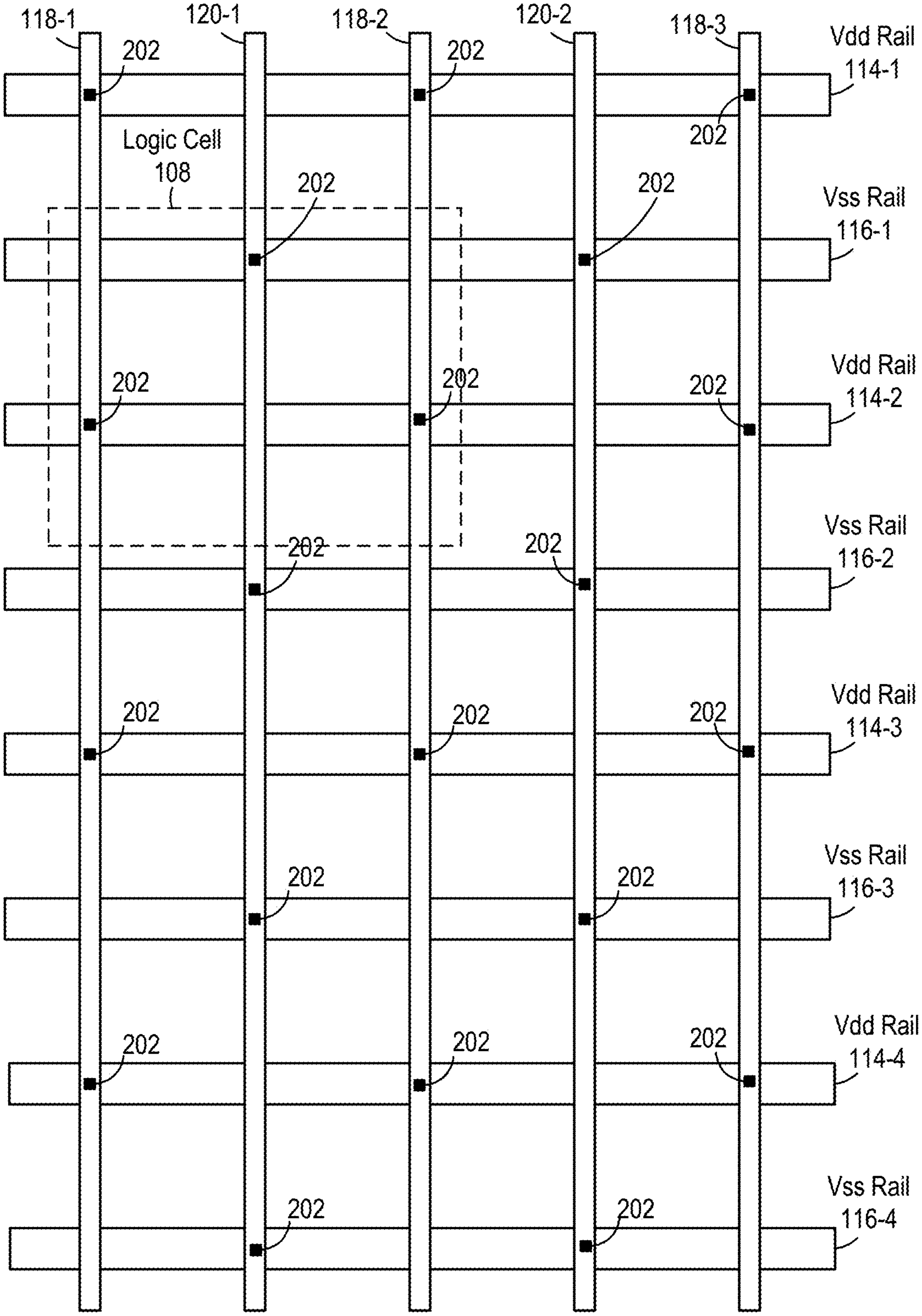
FIG. 2 is an illustration of a portion of the IC device, including relatively long Vss and Vdd tracks, according to an embodiment.

FIG. 2 is an illustration of a portion of IC device 100, according to an embodiment. In the example of FIG. 2, supply voltage tracks 118 include supply voltage tracks 118-1 through 118-3. Reference voltage tracks 120 include reference voltage tracks 120-1 and 120-2. Supply voltage tracks 118-1 through 118-3 and reference voltage tracks 120-1 and 120-2 are substantially perpendicular to supply voltage rails 114-1 through 114-4 and reference voltage rails 116-1 through 116-4.

Supply voltage tracks 118-1 through 118-3 encompass (i.e., extend over) supply voltage rails 114-1 through 114-4, and are coupled to supply voltage rails 114-1 through 114-4 via respective vias 202. Reference voltage tracks 120-1 and 120-2 encompass reference voltage rails 116-1 through 116-4, and are coupled to reference voltage rails 116-1 through 116-4 via respective vias 202. In the example of FIG. 2, supply voltage Vdd may be routed to logic cell 108 via supply voltage tracks 118-1 and 118-2. Reference voltage Vss may be routed to logic cell 108 via reference voltage track 120-1.

Figure 3:
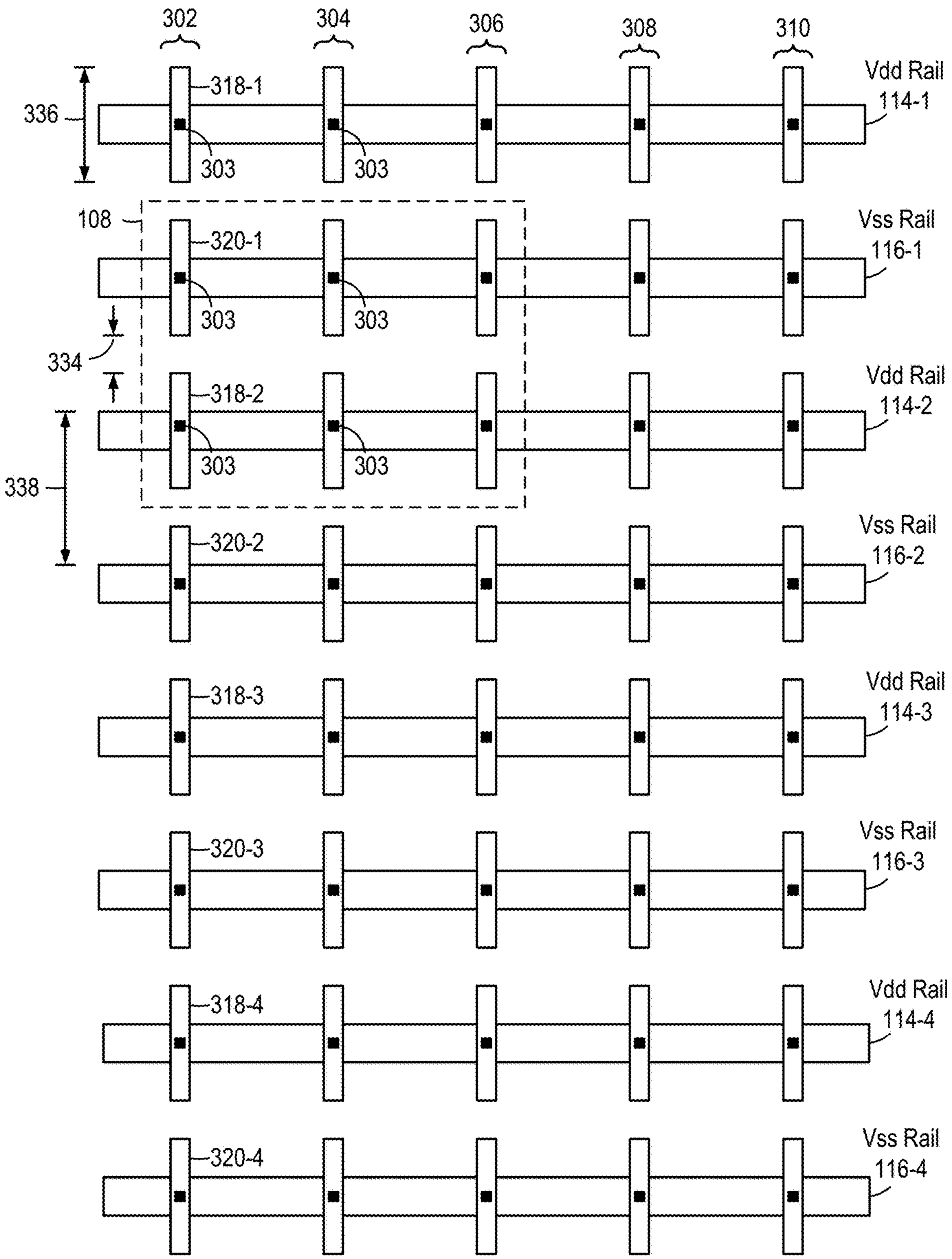
FIG. 3 is an illustration of a portion of the IC device in which the relatively long Vss and Vdd tracks of FIG. 2 are replaced with relatively short stubs, according to an embodiment.

FIG. 3 is an illustration of a portion of IC device 100 in which the Vss and Vdd tracks of FIG. 2 are replaced with relatively short stubs, according to an embodiment. In the example of FIG. 3, supply voltage tracks 118 and reference voltage tracks 120 are illustrated as columns of elongated metal stubs arranged in an alternating sequence of supply voltage stubs and reference voltage stubs. A first column 302 includes supply voltage stubs 318-1 through 318-4, and reference voltage stubs 320-1 through 320-4. The example of FIG. 3 may provide improved placement and routing options relative to the example of FIG. 1, which may be useful to reduce congestion.

In FIG. 3, adjacent stubs of column 302 are separated from one another by a stub spacing 334. A sum of stub spacing 334 and a stub length 336 is equal to a row height or spacing 338. Columns 304, 306, 308, and 310 may be similar or identical to column 302. Electrical connections between stubs and rails are provided with vias 303. At nanometer scales, relatively short stubs may necessitate smaller via radii due to mechanical considerations (e.g., mechanical stress reduction). For example, if the stub length 336 is shorter than row spacing 338, the via radii may need to be reduced. Smaller via radii may have higher IR drops, and may increase fabrication complexity and/or cost.

Figure 4:
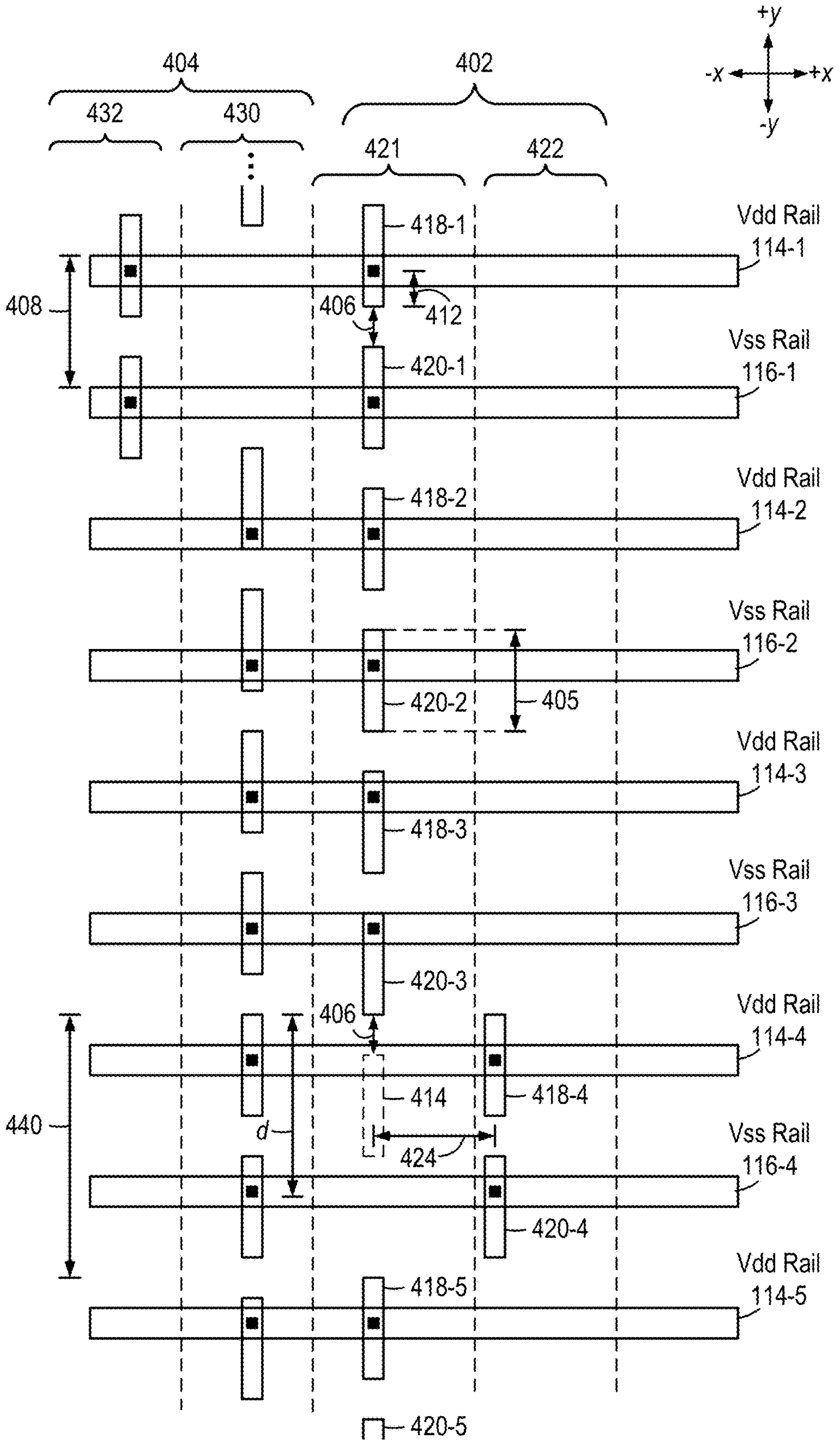
FIG. 4 is an illustration of a portion of IC device 100, in which the relatively short stubs of FIG. 3 are replaced with relatively long stubs, according to an embodiment.

FIG. 4 is an illustration of a portion of IC device 100, in which the relatively short stubs of FIG. 3 are replaced with relatively long stubs, according to an embodiment. As described further above, longer stub may permit greater via radii and/or may avoid reducing via radii, which may provide greater mechanical support and/or reduce fabrication complexity/cost. As also described further above, using a largest available via0 may permit a power grid to support greater numbers of standard cells.

In the example of FIG. 4, supply voltage tracks 118 and reference voltage tracks 120 are illustrated as columns 402 and 404 of elongated metal stubs, which may be arranged in an alternating sequence of supply voltage stubs and reference voltage stubs. Column 402 includes supply voltage stubs 418-1 through 418-5, and reference voltage stubs 420-1 through 420-5. Stubs 418 and 420 of column 402 have a length 405. Adjacent stubs of column 402 are separated from one another by a stub spacing 406. In the example of FIG. 4, length 405 of the stubs of column 402 may be greater than length 336 of stubs 318 and 320 of FIG. 3.

In FIG. 4, a sum of length 405 and stub spacing 406 exceeds a row spacing 408 of supply voltage rails 114 and reference voltage rails 116. In such a situation, an offset 412 between a stub end and a corresponding supply voltage rail 114 or reference voltage rail 116 increases or decreases in a y-direction. At some value of y, a stub will not sufficiently overlap a corresponding supply voltage rail 114 or reference voltage rail 116, which may reduce mechanical support. For example, if supply voltage stub 418-4 were placed at 414, supply voltage stub 418-4 may not sufficiently encompass or overlap supply voltage rail 114-4. To accommodate such a situation, column 402 may include multiple sub-columns, illustrated here as a primary column 421 and an overflow column 422. Primary column 421 includes a first subset of stubs of column 402 (i.e., supply voltage stubs 418-1, 418-2, 418-3, and 418-5, and reference voltage stubs 420-1, 420-2, 420-3, and 420-5). Overflow column 422 includes a second subset of stubs of column 402 (i.e., supply voltage stub 418-4 and reference voltage stub 420-4). Primary column 421 and overflow column 422 may be adjacent to one another, as illustrated in FIG. 4. Stubs of primary column 421 and stubs of overflow column 422 may be separated from one another in the x-direction by an offset 424.

In the example of FIG. 4, two adjacent/sequential stubs (i.e., supply voltage stub 418-4 and reference voltage stub 420-4) are placed in overflow column 422, and subsequent stubs (e.g., supply voltage stub 418-5 and reference voltage stub 420-5) are placed in primary column 421. In this example, stubs 420-3 and 418-5 are separated by a gap 440. IC device 100 is not, however, limited to this example. More than 2 sequential stubs, or a single stub may be placed in overflow column 422. The number of sequential stubs placed in overflow column 422 may be based on fabrication considerations, such as described further below.

Column 404 similarly includes a primary column 430 and an overflow column 432. Primary columns 421 and 430 may be positioned adjacent to one another, between overflow columns 422 and 432, as illustrated in FIG. 4. Such an arrangement may be useful for placement, area, fabrication and/or other considerations. Further in the example of FIG. 4, stubs of primary column 421 stubs of primary column 430 are offset from one another in the y direction. Offsetting in the y direction may be useful for IR and/or RC balancing (e.g., balance IR loading on rails 114 and 116).

In the example of FIG. 4, Vdd stubs 418 are separated from one another by a distance d=((stub length 405)+2. (stub spacing 406)).

The example of FIG. 4 may retain and/or improve routing options relative to the example of FIG. 2, and may reduce IR drop relative to the example of FIG. 3, in addition to providing advantages of greater via radii described further above.

Stubs 418 and 420 may be fabricated on single interconnect level of IC device 100 or may be fabricated over multiple interconnect levels of IC device 100, examples of which are provided further below.

During a design phase of IC device 100, an electronic design automation tool may employ a flexible walking technique to design a power grid, such as described below with reference to FIGS. 5 through 9B.

Figure 5:
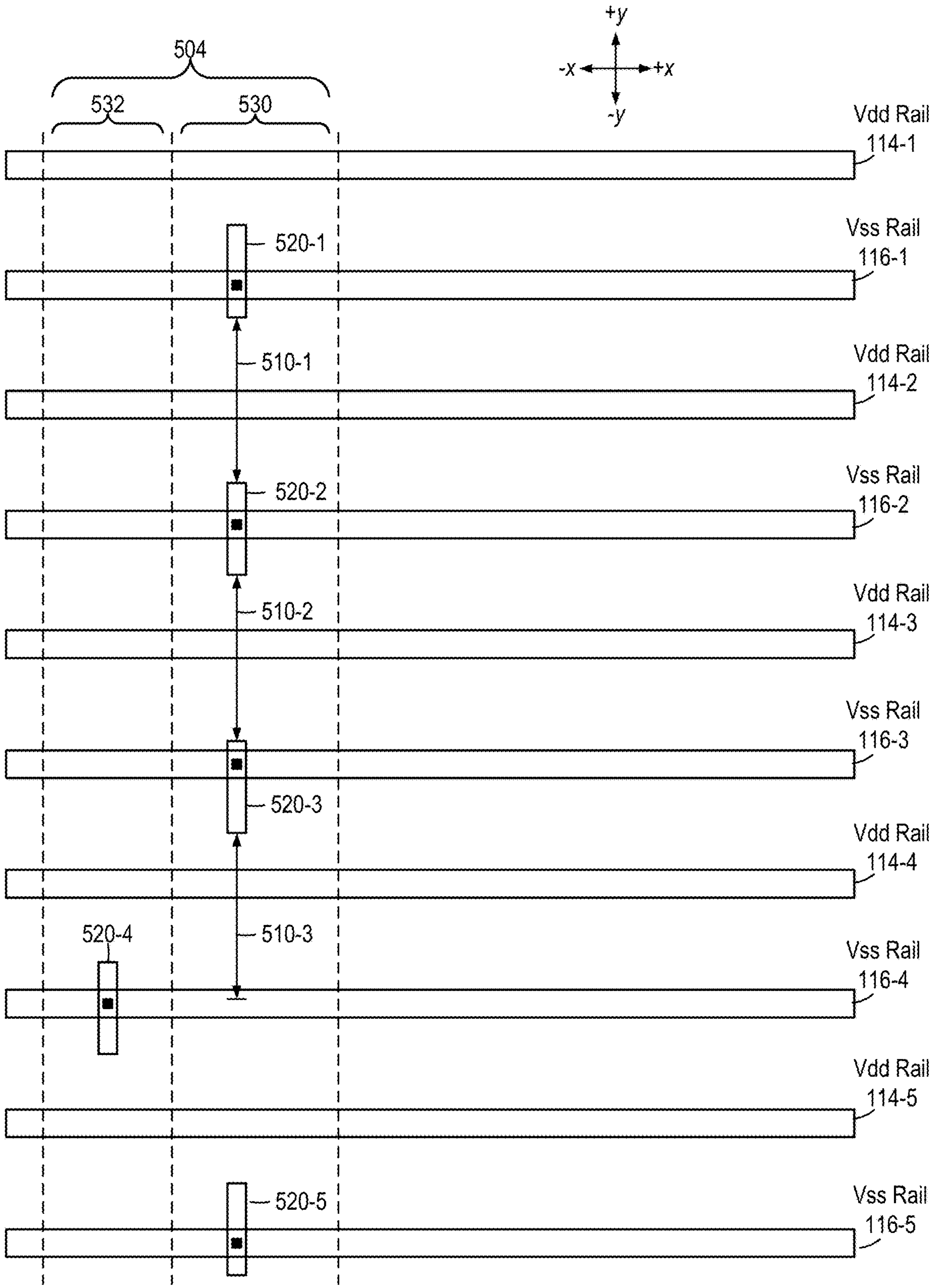
FIG. 5 illustrates a design phase for a first column of reference voltage stubs, according to an embodiment.

FIG. 5 illustrates a design phase for a first column 504 of reference voltage stubs 520, according to an embodiment. First column 504 includes a primary column 530 and an overflow column 532.

Figure 6:
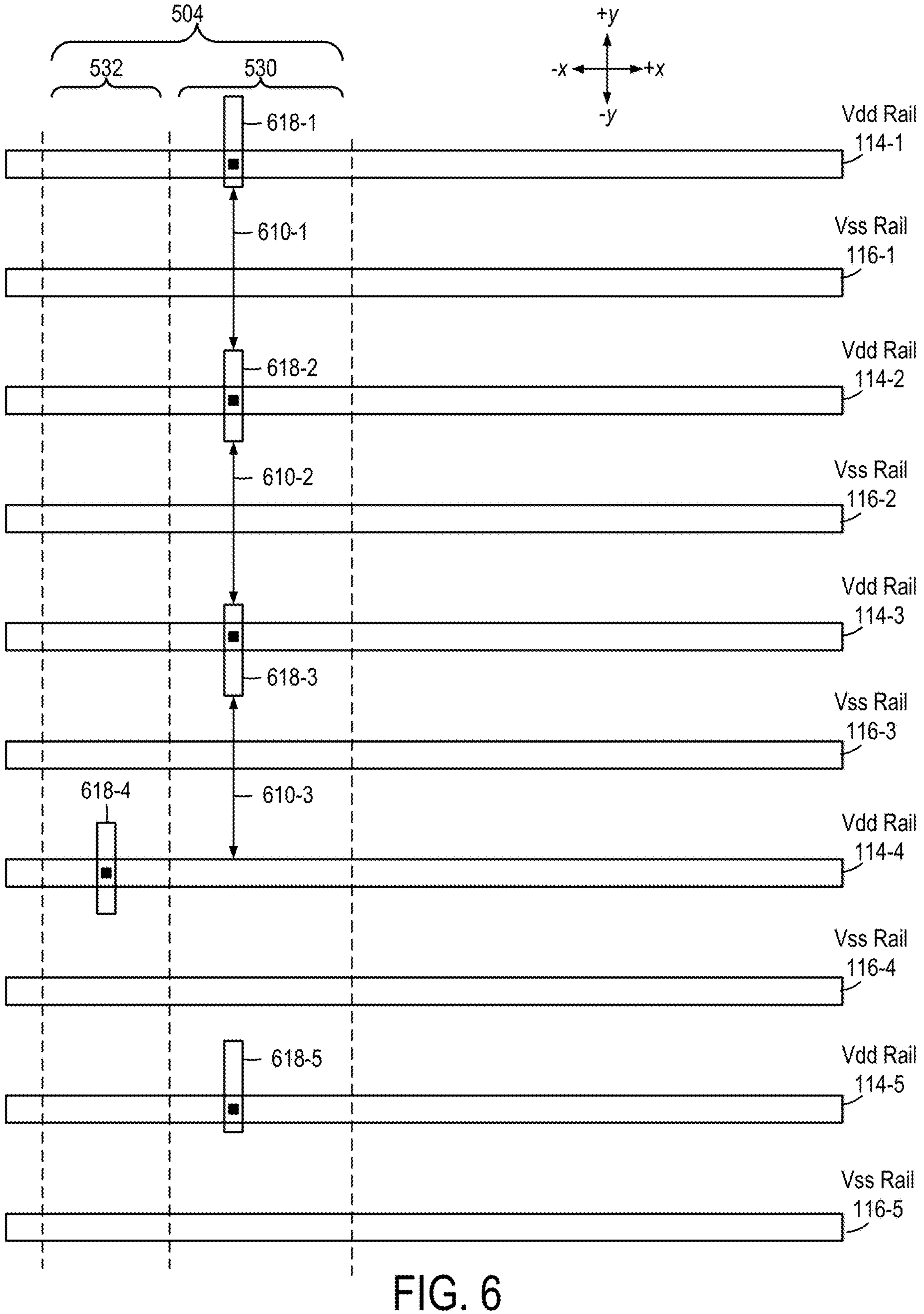
FIG. 6 illustrates a design phase of supply voltage stubs of the first column of the circuit design, according to an embodiment.

FIG. 6 illustrates a design phase of supply voltage stubs of first column 504, according to an embodiment.

Figure 7:
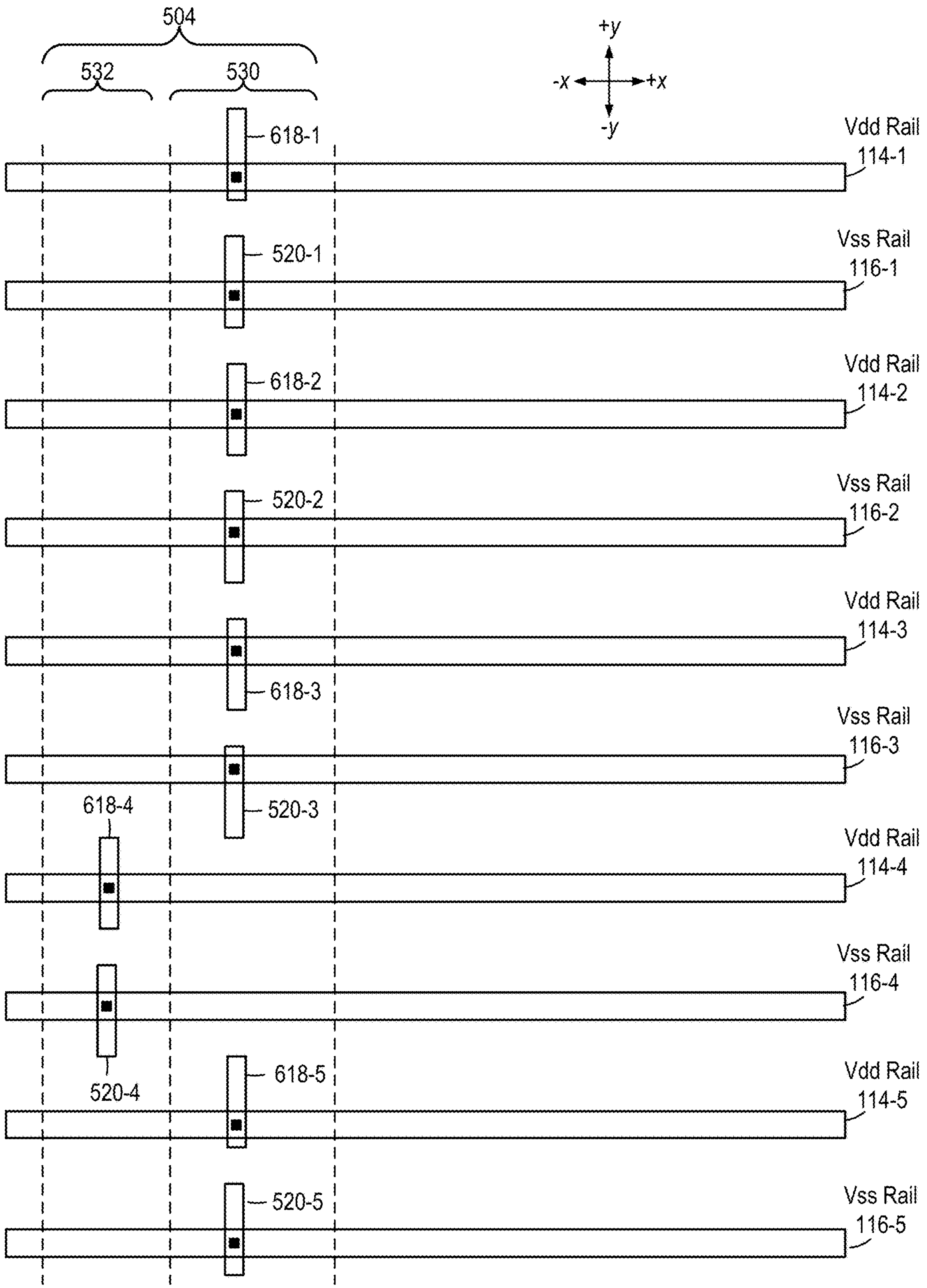
FIG. 7 illustrates results of the design phases of FIGS. 5 and 6, according to an embodiment.

FIG. 7 illustrates results of the design phases of FIGS. 5 and 6, according to an embodiment.

Figure 8:
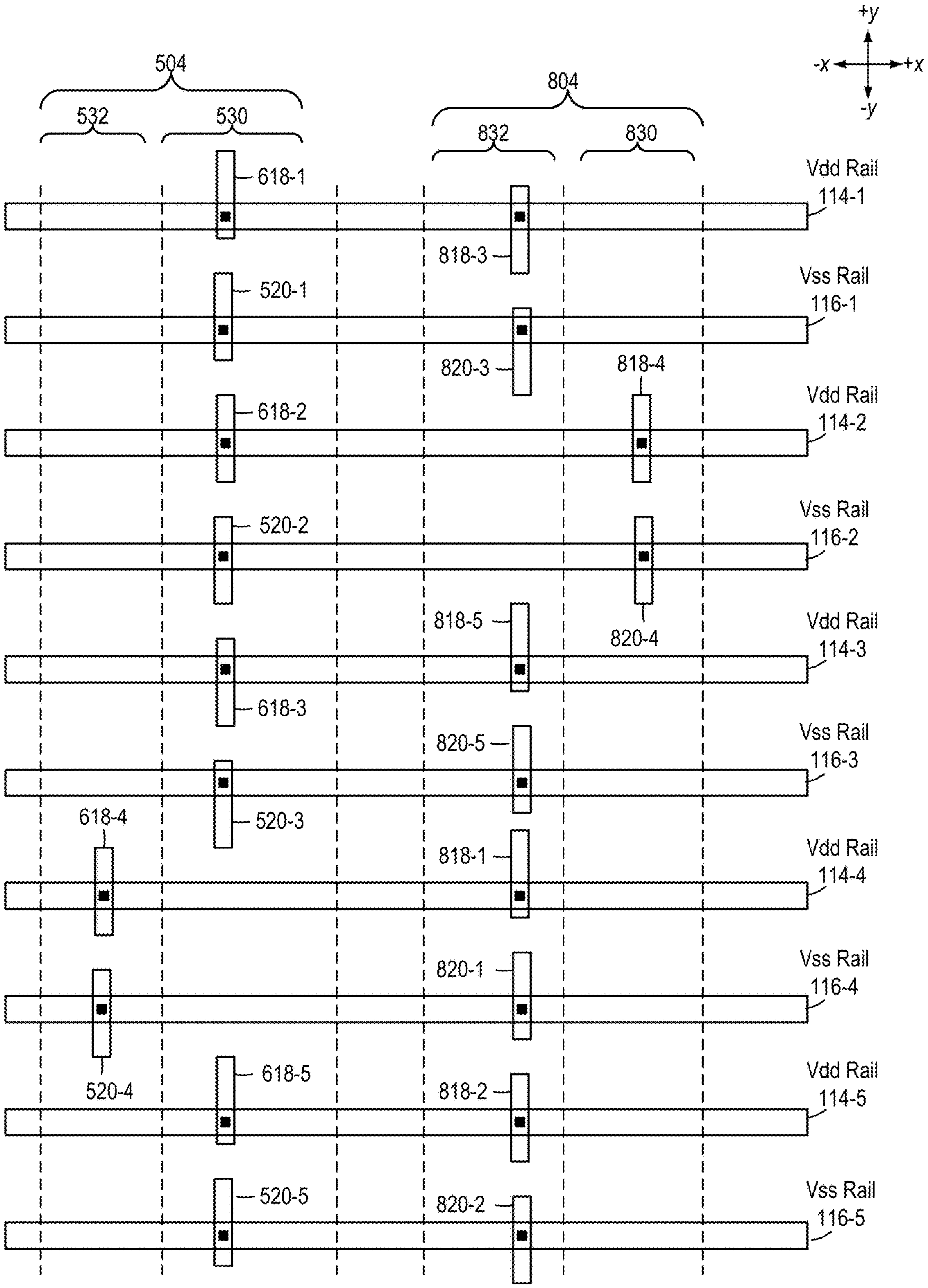
FIG. 8 illustrates a design phase for a second column of reference voltage stubs and supply voltage stubs of the circuit design, according to an embodiment.

FIG. 8 illustrates a design phase for a second column 804 of reference voltage stubs and supply voltage stubs, according to an embodiment. Second column 804 includes a primary column 832 and an overflow column 830.

Figure 9A:
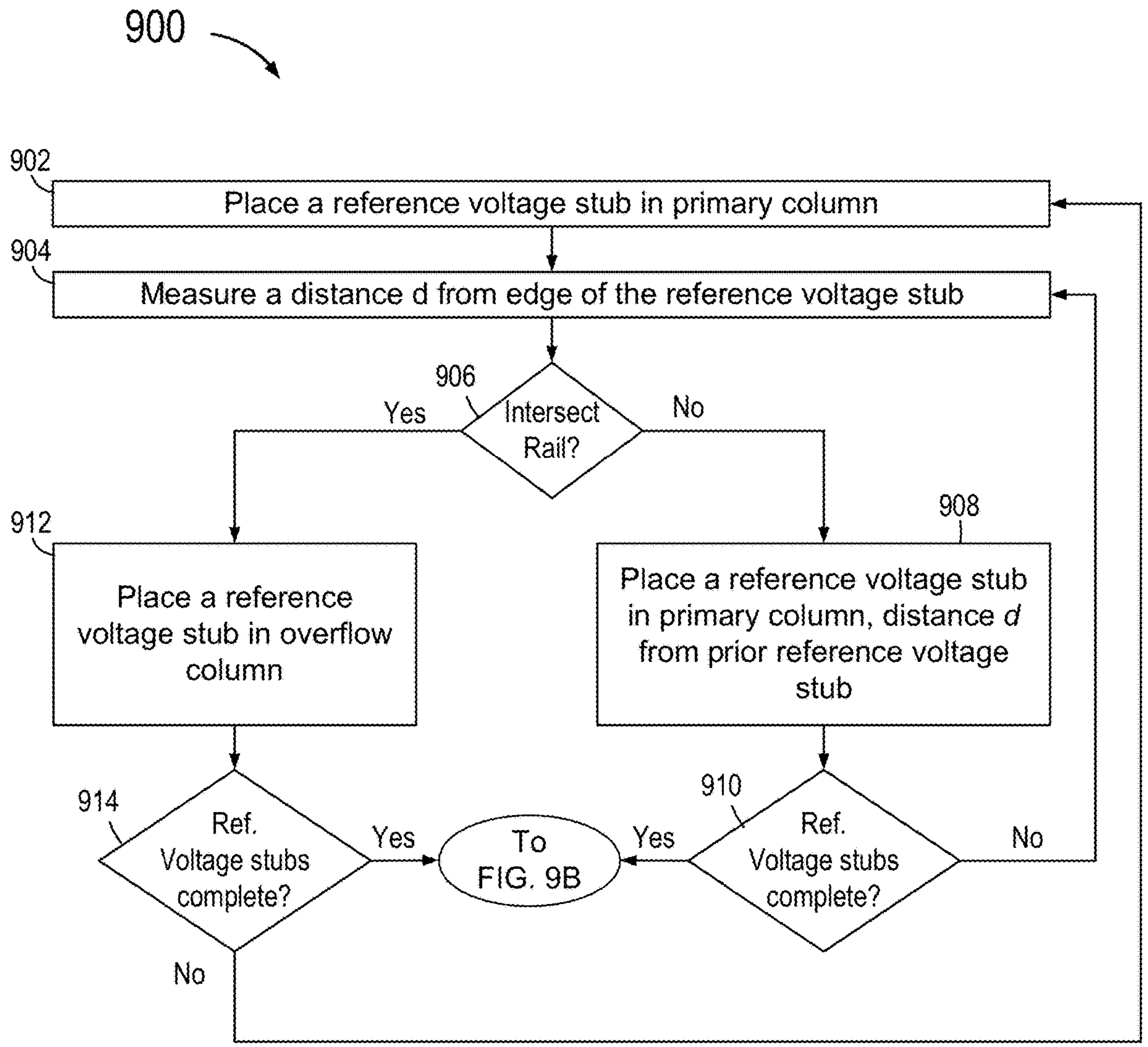
FIGS. 9A and 9B illustrate a method of designing reference voltage stubs and supply voltage stubs for a power grid of an IC design, according to an embodiment.
Figure 9B:
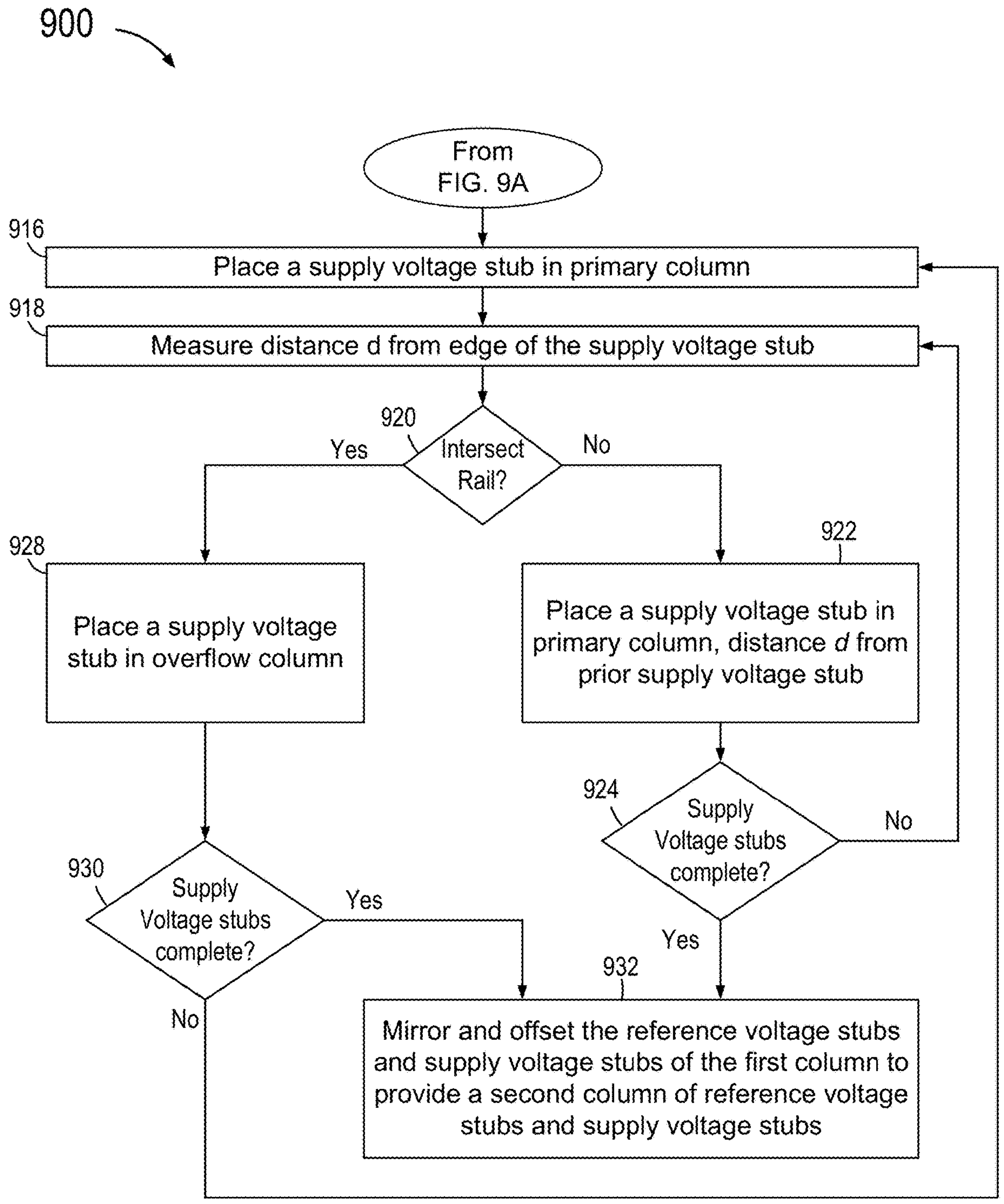

FIGS. 5-8 are described below with reference to FIGS. 9A and 9B. FIGS. 9A and 9B illustrate a method 900 of designing reference voltage stubs and supply voltage stubs for a power grid of an IC design based on a walking pattern, according to an embodiment. Method 900 is described below with reference to FIGS. 5-8. Method 900 is not, however, limited to the examples of FIGS. 5-8. Method 900 may be performed by an electronic design automation (EDA tool/computing platform). In FIG. 9A, the EDA tool places reference voltage stubs of a first column 504 of the IC design. FIG. 9A is described below with reference to FIG. 5. In FIG. 9B, the EDA tool places supply voltage stubs of the first column 504 of the IC design, and places reference voltage stubs and supply voltage stubs of a second column of the IC design. FIG. 9B is described further below with reference to FIGS. 6, 7, and 8.

At 902, the EDA tool places a reference voltage stub 520-1 over reference voltage rail 116-1, within a primary column 530 of first column 504.

At 904, the EDA tool determines distance d (510-1 in FIG. 5) from an edge of reference voltage stub 520-1.

At 906, if the distance d does not coincide with (i.e., reach or intersect) any of rails 114 or 116, processing proceeds to 908, where the EDA tool places a reference voltage stub 520-2 over reference voltage rail 116-2 within primary column 530, at distance d from the edge of reference voltage stub 520-1.

At 910, if placement of reference voltage stubs in column 504 is complete, processing proceeds to 916 in FIG. 9B. If placement of reference voltage stubs in column 504 is incomplete, processing returns to 904, where the EDA tool determines distance d (510-2 in FIG. 5) from an edge of reference voltage stub 520-2. Processing then proceeds through 906 to 908, where the EDA tool places reference voltage stub 520-3 over reference voltage rail 116-3, distance d from the edge of reference voltage stub 520-2.

Processing then proceeds through 910 back to 904, where the EDA tool determines distance d (510-3 in FIG. 5) from an edge of reference voltage stub 520-3.

Processing then proceeds to 906, where the EDA tool determines that the distance d (510-3 in FIG. 5) from the edge of reference voltage stub 520-3 coincides with reverence voltage rail 116-4. In this situation, processing proceeds to 912, where the EDA tool places reference voltage stub 520-4 over reference voltage rail 116-4, in an overflow column 532 of first column 504 rather than primary column 530.

At 914, if placement of reference voltage stubs is incomplete, processing returns to 902, where the EDA tool places a reference voltage stub 520-5 over reference voltage rail 116-5. In an embodiment, the EDA tool may place a copy of reference voltage stubs 520-1 through 520-4, beginning at the location of reference voltage stub 520-5 (i.e., such that reference voltage stub 520-5 is a copy of reference voltage stub 520-1). Processing continues until placement of reference voltages stubs is complete at 910 or 914.

At 916 (FIG. 9B), the EDA tool places a supply voltage stub 618-1 over supply voltage rail 114-1, within primary column 530 of first column 504.

At 918, the EDA tool determines distance d (610-1 in FIG. 6) from an edge of supply voltage stub 618-1.

At 920, if the distance d does not coincide with (i.e., reach or intersect) any of rails 114 or 116, processing proceeds to 922, where the EDA tool places a supply voltage stub 618-2 over supply voltage rail 114-2 within primary column 530, at distance d from the edge of supply voltage stub 618-1.

At 924, if placement of reference voltage stubs in column 504 is complete, processing proceeds to 932, which is described further below. If placement of reference voltage stubs in column 504 is incomplete, processing returns to 918, where the EDA tool determines distance d (610-2 in FIG. 6) from an edge of supply voltage stub 618-2. Processing then proceeds through 920 to 922, where the EDA tool places supply voltage stub 618-3 over supply voltage rail 114-3, distance d from the edge of supply voltage stub 618-2.

Processing then proceeds through 924 back to 918, where the EDA tool determines distance d (610-3 in FIG. 6) from an edge of supply voltage stub 618-3.

Processing then proceeds to 920, where the EDA tool determines that the distance d (610-3 in FIG. 6) from the edge of supply voltage stub 618-3 coincides with supply voltage rail 114-4. In this situation, processing proceeds to 928, where the EDA tool places supply voltage stub 618-4 over supply voltage rail 114-4, in overflow column 532 of first column 504 rather than primary column 530.

At 930, if placement of supply voltage stubs is incomplete, processing returns to 916, where the EDA tool places a supply voltage stub 618-5 over supply voltage rail 114-5. In an embodiment, the EDA tool may place a copy of supply voltage stubs 618-1 through 618-4, beginning at the location of supply voltage stub 618-5 (i.e., such that supply voltage stub 618-5 is a copy of supply voltage stub 618-1). Processing continues until placement of supply voltage stubs is complete at 924 or 930.

At 932, the EDA tool generates a mirror image of the reference voltage stubs 520 and the supply voltage stubs 618 of first column 504, and shifts or offsets the mirror image in the y direction, to provide a second column 804 of reference voltage stubs 820 and supply voltage stubs 818 (FIG. 8). Reference voltage stubs 820 and supply voltage stubs 818 of column 804 may represent copies of reference voltage stubs 520 and supply voltage stubs 618, such as illustrated in the cross-correlation of Table 1 below.

TABLE 1

| Column 504 Stubs | Column 804 Stubs |
|---|---|
| 618-1 | 818-1 |
| 520-1 | 820-1 |
| 618-2 | 818-2 |
| 520-2 | 820-2 |
| 618-3 | 818-3 |
| 520-3 | 820-3 |
| 618-4 | 818-4 |
| 520-4 | 820-4 |
| 618-5 | 818-5 |
| 520-5 | 820-5 |

A method of fabricating a power distribution network based on a walking pattern is provided below with reference to FIGS. 10-13. Methods of fabricating a power distribution network based on a walking pattern are not, however, limited to the example below.

Figure 10:
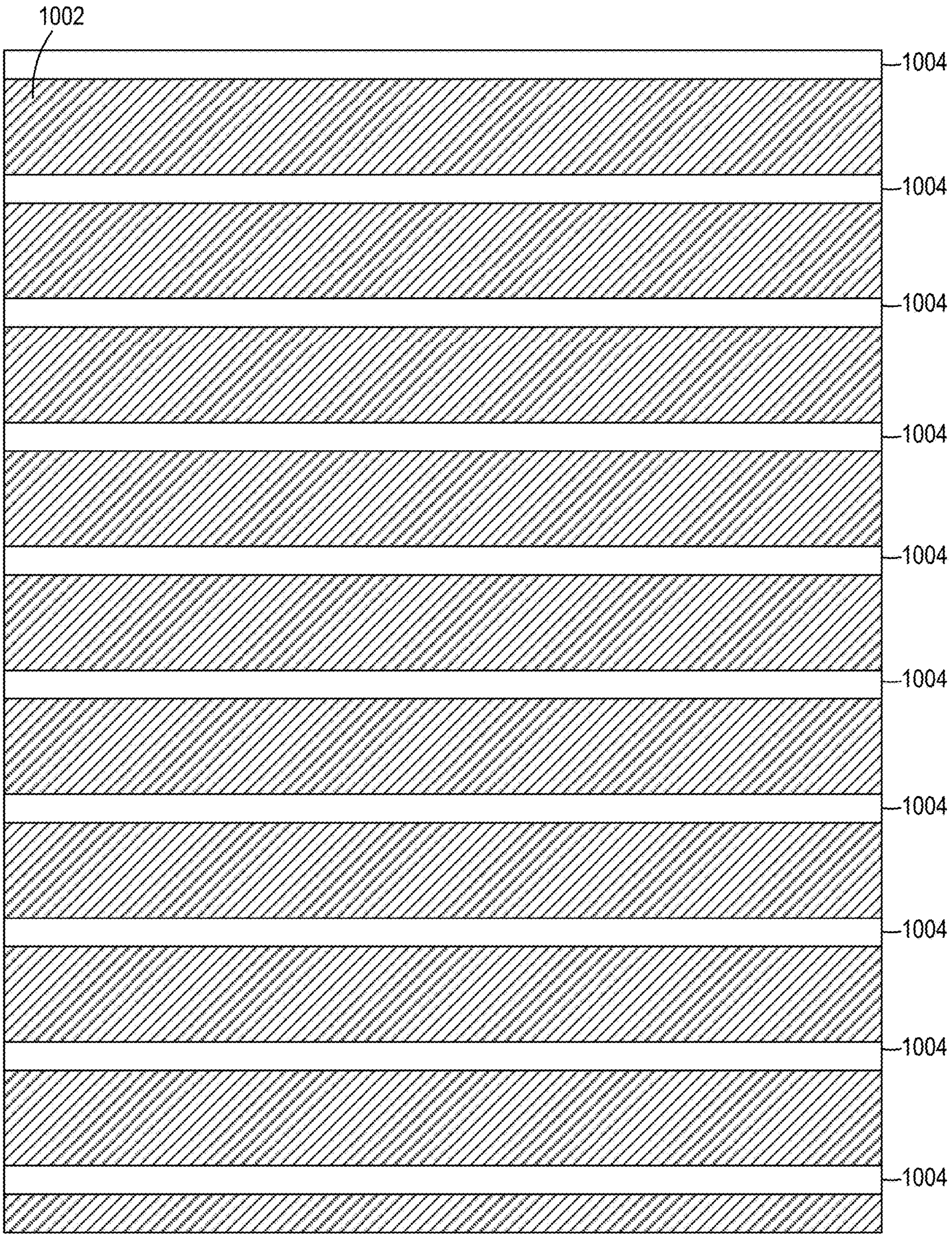
FIG. 10 is an illustration of mask portions positioned over a first metal layer to form power distribution rails, according to an embodiment.

FIG. 10 is an illustration of mask portions 1004 positioned over a metal layer 1002 to form supply voltage rails 114 and reference voltage rails 116, according to an embodiment. Metal layer 1002 may correspond to rails level 100 in FIG. 1. Metal layer 1002 may represent an M0 layer.

Figure 11:
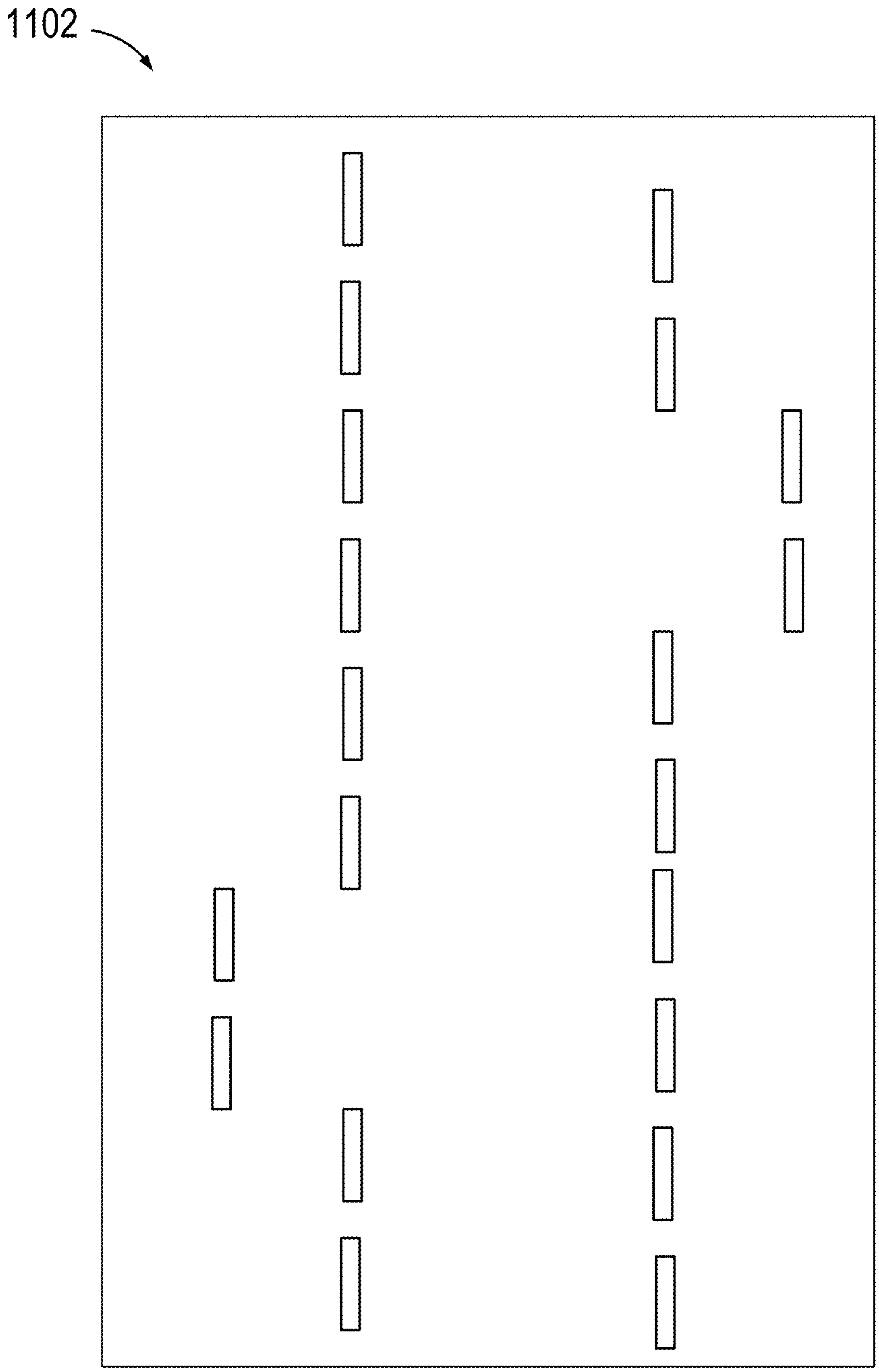
FIG. 11 is an illustration of a mask portion designed to form power distribution stubs, according to an embodiment.

FIG. 11 is an illustration of a mask portion 1102 designed to form stubs 520, 618, 818, and 820 (FIG. 8), according to an embodiment.

Figure 12:
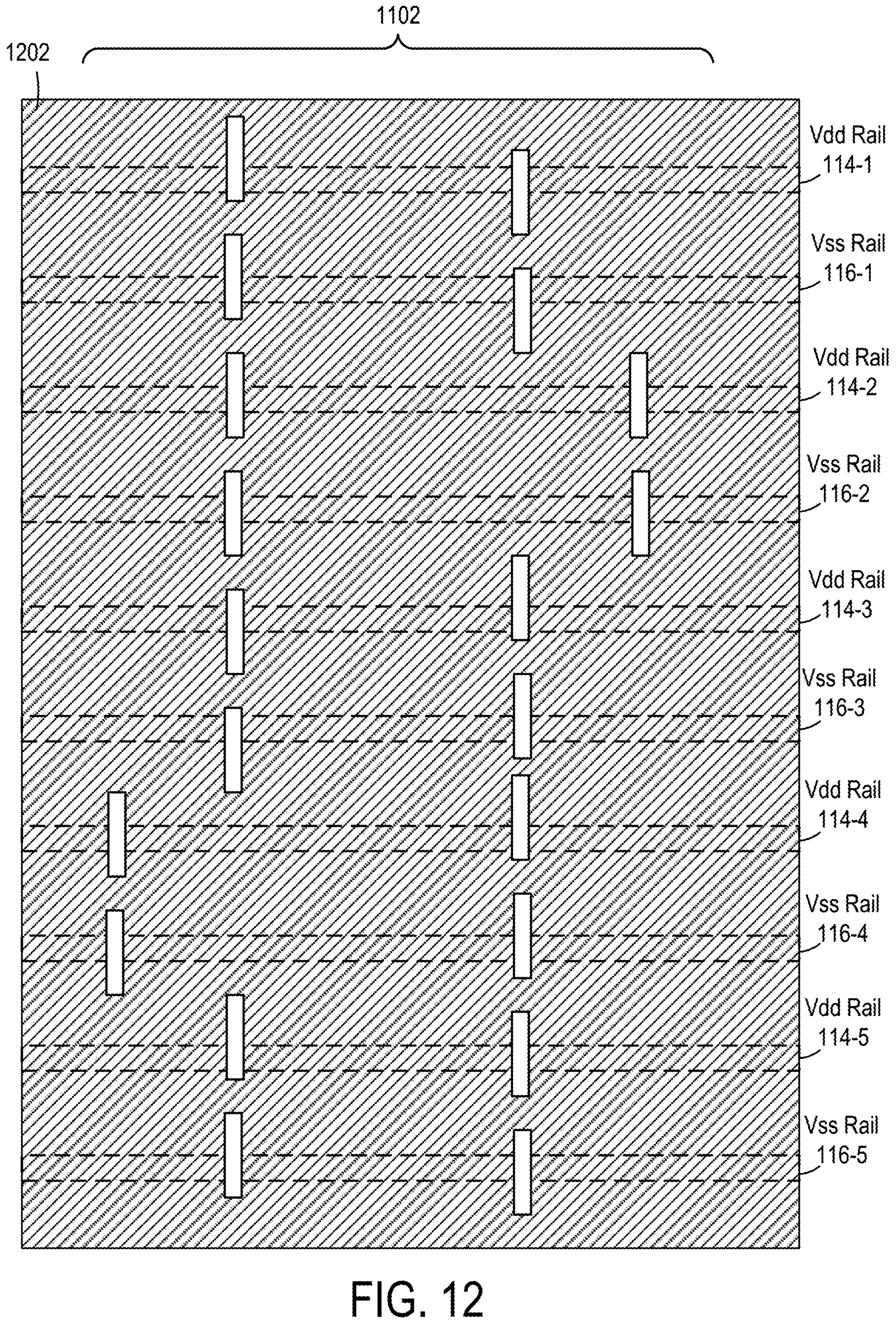
FIG. 12 is an illustration of the mask portion of FIG. 12 positioned over a second metal layer, according to an embodiment.

FIG. 12 is an illustration of mask portion 1102 applied to metal layer 1202, according to an embodiment. Metal layer 1202 may correspond to interconnect level 102 in FIG. 1. Metal layer 1202 may represent an M1 layer. In the example of FIG. 12, rails 114 and 116 are superimposed behind metal layer 1102, for illustrative purposes. FIGS. 10, 11, and 12 are described below with reference to FIG. 13.

Figure 13:
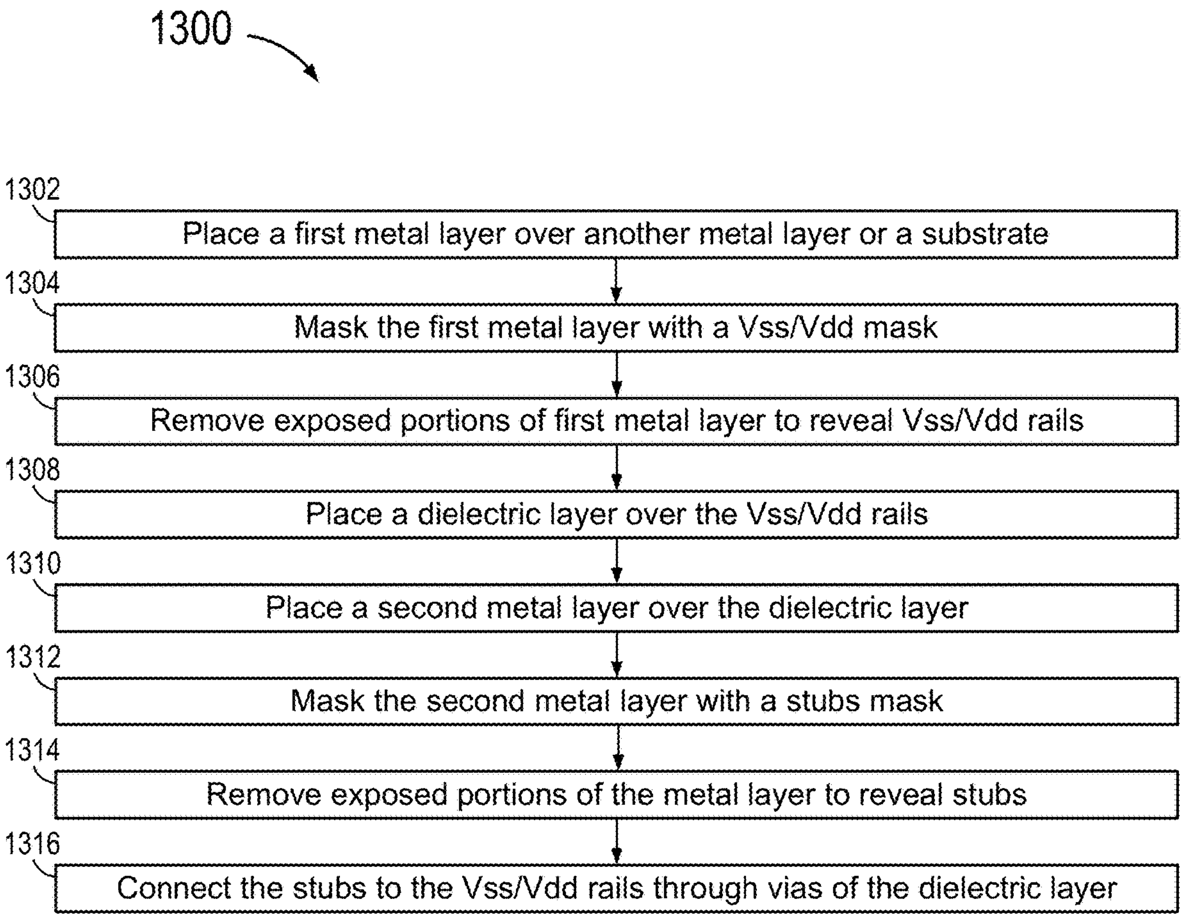
FIG. 13 illustrates a method of fabricating a power distribution network of an IC device, according to an embodiment.

FIG. 13 illustrates a method 1300 of fabricating a power distribution network of an IC device, according to an embodiment. Method 1300 is described below with reference to FIGS. 10, 11, and 12. Method 1300 is not, however, limited to the examples of FIGS. 10, 11, and 12.

At 1302, an IC fabricator places (e.g., deposits) metal layer 1002 over another layer or a substrate of an IC device.

At 1304, the IC fabricator places mask portions 1004 over metal layer 1002, as illustrated in FIG. 10.

At 1306, the IC fabricator removes (e.g., etches) exposed portions of metal layer 1002 (i.e., portions of metal layer 1002 that to which mask portions 1004 are not applied) to provide rails 114 and 116.

At 1308, the IC fabricator places (e.g., forms/deposits) a dielectric layer over rails 114 and 116.

At 1310, the IC fabricator places metal layer 1202 over the dielectric layer.

At 1312, the IC fabricator applies mask portion 1102 to metal layer 1202, as illustrated in FIG. 12.

At 1314, the IC fabricator removes exposed portions of metal layer 1202 (i.e., portions of metal layer 1202 to which mask portion 1102 is not applied) to provide stubs 520, 618, 818, and 820.

At 1316, the IC fabricator connects stubs 520, 618, 818, and 820 to respective rails 114 and 116 through vias of the dielectric layer to provide a power distribution network, such as illustrated in FIG. 9.

Figure 14:
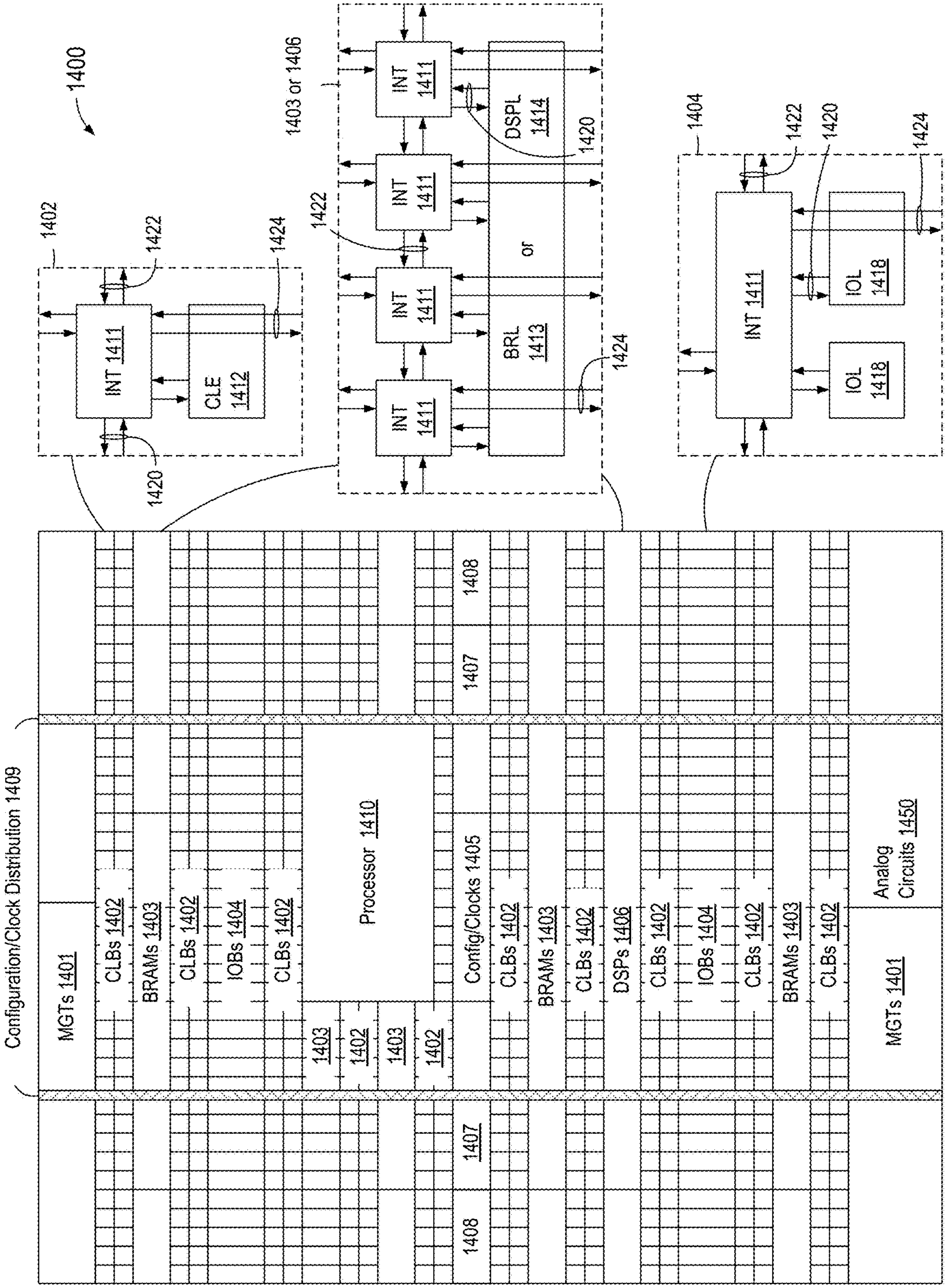
FIG. 14 is a block diagram of configurable circuitry, including an array of configurable or programmable circuit blocks or tiles, according to an embodiment.

IC level 106 and/or logic cells 108, may include one or more of a variety of types of configurable circuit blocks, such as described below with reference to FIG. 14. FIG. 14 is a block diagram of configurable circuitry 1400, including an array of configurable or programmable circuit blocks or tiles, according to an embodiment. The example of FIG. 14 may represent a field programmable gate array (FPGA) and/or other IC device(s) that utilizes configurable interconnect structures for selectively coupling circuitry/logic elements, such as complex programmable logic devices (CPLDs).

In the example of FIG. 14, the tiles include multi-gigabit transceivers (MGTs) 1401, configurable logic blocks (CLBs) 1402, block random access memory (BRAM) 1403, input/output blocks (IOBs) 1404, configuration and clocking logic (Config/Clocks) 1405, digital signal processing (DSP) blocks 1406, specialized input/output blocks (I/O) 1407 (e.g., configuration ports and clock ports), and other programmable logic 1408, which may include, without limitation, digital clock managers, analog-to-digital converters, and/or system monitoring logic. The tiles further includes a dedicated processor 1410.

One or more tiles may include a programmable interconnect element (INT) 1411 having connections to input and output terminals 1420 of a programmable logic element within the same tile and/or to one or more other tiles. A programmable INT 1411 may include connections to interconnect segments 1422 of another programmable INT 1411 in the same tile and/or another tile(s). A programmable INT 1411 may include connections to interconnect segments 1424 of general routing resources between logic blocks (not shown). The general routing resources may include routing channels between logic blocks (not shown) including tracks of interconnect segments (e.g., interconnect segments 1424) and switch blocks (not shown) for connecting interconnect segments. Interconnect segments of general routing resources (e.g., interconnect segments 1424) may span one or more logic blocks. Programmable INTs 1411, in combination with general routing resources, may represent a programmable interconnect structure.

A CLB 1402 may include a configurable logic element (CLE) 1412 that can be programmed to implement user logic. A CLB 1402 may also include a programmable INT 1411.

A BRAM 1403 may include a BRAM logic element (BRL) 1413 and one or more programmable INTs 1411. A number of interconnect elements included in a tile may depends on a height of the tile. A BRAM 1403 may, for example, have a height of five CLBs 1402. Other numbers (e.g., four) may also be used.

A DSP block 1406 may include a DSP logic element (DSPL) 1414 in addition to one or more programmable INTs 1411. An IOB 1404 may include, for example, two instances of an input/output logic element (IOL) 1415 in addition to one or more instances of a programmable INT 1411. An I/O pad connected to, for example, an I/O logic element 1415, is not necessarily confined to an area of the I/O logic element 1415.

In the example of FIG. 14, config/clocks 1405 may be used for configuration, clock, and/or other control logic. Vertical columns 1409 may be used to distribute clocks and/or configuration signals.

A logic block (e.g., programmable of fixed-function) may disrupt a columnar structure of configurable circuitry 1400. For example, processor 1410 spans several columns of CLBs 1402 and BRAMs 1403. Processor 1410 may include one or more of a variety of components such as, without limitation, a single microprocessor to a complete programmable processing system of microprocessor(s), memory controllers, and/or peripherals.

In FIG. 14, configurable circuitry 1400 further includes analog circuits 1450, which may include, without limitation, one or more analog switches, multiplexers, and/or de-multiplexers. Analog switches may be useful to reduce leakage current.

FIG. 14 is provided for illustrative purposes. Configurable circuitry 1400 is not limited to numbers of logic blocks in a row, relative widths of the rows, numbers and orderings of rows, types of logic blocks included in the rows, relative sizes of the logic blocks, illustrated interconnect/logic implementations, or other example features of FIG. 14.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the “C” programming language or similar programming languages. The program code may execute entirely on the user’s computer, partly on the user’s computer, as a stand-alone software package, partly on the user’s computer and partly on a remote computer or entirely on the remote computer or server. In the latter scenario, the remote computer may be connected to the user’s computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. An integrated circuit (IC) device, comprising:

multiple voltage rails arranged in a plane parallel to one another, wherein adjacent ones of the voltage rails are separated from one another by a row spacing; and a first column of elongated metal stubs, perpendicular to the voltage rails, wherein each of the elongated metal stubs is coupled to a respective ones of the voltage rails, wherein each of the elongated metal stubs has a stub length, wherein adjacent ones of the elongated metal stubs are separated from one another by a stub spacing, and wherein a sum of the stub spacing and the stub length exceeds the row spacing.

2. The IC of claim 1, wherein:

the first column comprises a primary column;

the primary column comprises a first subset of the elongated metal stubs, arranged linearly, length-wise;

adjacent ones of the elongated metals stubs of the first subset are separated from one another by the stub spacing; and a sum of the stub spacing and a length of the elongated metal stubs of the first subset exceeds the row spacing such that offsets between the elongated metal stubs of the first subset and the corresponding voltage rails increase along a length of the first subset.

3. The IC of claim 2, wherein:

the primary column further comprises a second subset of the elongated metal stubs, arranged linearly, length-wise;

adjacent ones of the elongated metals stubs of the second subset are separated from one another by the stub spacing;

the first and second subsets are aligned linearly, length-wise, with respect to one another; and the first and second subsets are separated from one another by a gap that encompasses an intervening one of the voltage rails.

4. The IC of claim 3, wherein a distance between the first subset of the elongated metal stubs and the intervening voltage rail, along a line between the first and second subsets, is less than the stub spacing.

5. The IC of claim 3, wherein the first column further comprises an overflow column that comprises one of the elongated metal stubs coupled to the intervening voltage rail.

6. The IC of claim 5, further comprising a second column of elongated metal stubs, wherein the second column of elongated metal stubs is arranged as a mirror-image of the first column of elongated metal stubs, longitudinally offset from the first column of elongated metal stubs.

7. The IC of claim 1, wherein the voltage rails comprise supply voltage rails and reference voltage rails arranged in an alternating fashion such that the first column of elongated metal stubs form an alternating sequence of supply voltage stubs and reference voltage stubs.

8. The IC of claim 1, further comprising:

a first set of one or more metal layers that comprise the voltage rails; and a second set of one or more metal layers that comprise the elongated metal stubs.

9. An integrated circuit (IC) power distribution grid, comprising:

a first metal layer comprising multiple rows of metal tracks separated from one another by a row spacing; and a second metal layer comprising a first column of elongated metal stubs, perpendicular to the rows of metal tracks of the first metal layer; and a dielectric layer between the first and second metal layers;

wherein:

the first column comprises a primary column that includes a first subset of the elongated metal stubs arranged linearly, length-wise;

each of the elongated metal stubs of the primary column is coupled to a respective one of the metal tracks of the first metal layer;

each of the elongated metal stubs of the primary column has a stub length;

adjacent ones of the elongated metals stubs of the first subset are separated from one another by a stub spacing; and a sum of the stub spacing and the stub length exceeds the row spacing.

10. The IC of claim 9, wherein:

the primary column further comprises a second subset of the elongated metal stubs, arranged linearly, length-wise;

each of the elongated metal stubs of the second subset is coupled to a respective one of the metal tracks of the first metal layer;

adjacent ones of the elongated metals stubs of the second subset are separated from one another by the stub spacing;

the first and second subsets are aligned linearly, length-wise, with respect to one another; and the first and second subsets are separated from one another by a gap that encompasses an intervening one of the metal tracks of the first metal layer.

11. The IC of claim 10, wherein a distance between the first subset and the intervening metal track, along a line between the first and second subsets, is less than the stub spacing.

12. The IC of claim 10, wherein the first column further comprises an overflow column that comprises one of the elongated metal stubs coupled to the intervening metal track of the first metal layer through a via of the dielectric layer.

13. The IC of claim 12, further comprising a second column of elongated metal stubs, wherein the second column of elongated metal stubs is arranged as a mirror-image of the first column of elongated metal stubs, longitudinally offset from the first column of elongated metal stubs.

14. The IC of claim 9, wherein:

a first subset of the metal tracks of the first metal layer are configured as supply voltage rails; and a second subset of the metal tracks of the first metal layer are configured as reference voltage rails, wherein the supply voltage rails and the reference voltage rails are arranged in an alternating fashion such that the first column of elongated metal stubs form an alternating sequence of supply voltage stubs and reference voltage stubs.

15. The IC of claim 9, wherein the dielectric layer has a matrix of metal-filled vias aligned with the elongated metal stubs that connect the elongated metal stubs with respective ones of the metal tracks of the first layer.

16. A method, comprising:

placing multiple rows of tracks in a first metal layer of an integrated circuit (IC) design, wherein the tracks are arranged in an alternating sequence of supply voltage tracks and reference voltage tracks; and placing a first column of elongated stubs in a second metal layer of the IC design, perpendicular to the rows of tracks of the first layer, and coupling the elongated stubs to respective ones of the tracks of the first metal layer, through vias of a dielectric layer placed between the first and second metal layers, to provide an alternating sequence of supply voltage stubs and reference voltage stubs;

wherein:

the elongated stubs have a stub length;

adjacent ones of the elongated stubs are separated from one another by a stub spacing; and a sum of the stub length and the stub spacing exceeds a row spacing of the rows of tracks in the first metal layer.

17. The method of claim 16, wherein:

offsets between the elongated stubs and the tracks increase along the first column of elongated stubs.

18. The method of claim 16, wherein the first column comprises a primary column and an overflow column, and wherein the placing the first column of elongated stubs comprises:

placing a first one of the elongated stubs in the primary column such that the first elongated stub encompasses a width of a first one of the tracks of the first layer; and placing a second one of the elongated stubs in the primary column, a distance d from an end of the first elongated stub, if the placing of the second elongated stub in the primary column results in the second elongated stub encompassing a second one of the tracks of the first layer, else placing the second elongated stub in the overflow column;

wherein the distance d equals a sum of the stub length and twice the stub spacing; and wherein the first and second tracks of the first layer comprise one of the supply voltage stubs and the reference voltage stubs.

19. The method of claim 18, wherein the placing the first column of elongated stubs further comprises:

placing a third one of the elongated stubs in the primary column, spaced apart from the first elongated stub by the stub spacing, such that the second elongated stub encompasses a width of a third one of the tracks of the first layer, wherein the third track is between the first and second tracks; and placing a fourth one of the elongated stubs in the primary column, distance d from an end of the third elongated stub, if the placing of the fourth elongated stub in the primary column results in the fourth elongated stub encompassing a fourth one of the tracks of the first layer, else placing the fourth elongated stub in the overflow column.

20. The method of claim 19, further comprising:

placing a mirror-version of the first column of elongated stubs as a second column in the second metal layer, offset from the first column by an even number of the tracks of the first layer.

* * * * *